United States Patent
Cheng et al.

(10) Patent No.: US 10,832,963 B2
(45) Date of Patent: Nov. 10, 2020

(54) FORMING GATE CONTACT OVER ACTIVE FREE OF METAL RECESS

(71) Applicant: International Business Machines Corporation, Armonk, NY (US)

(72) Inventors: Kangguo Cheng, Schenectady, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/113,953

(22) Filed: Aug. 27, 2018

(65) Prior Publication Data
US 2020/0066597 A1    Feb. 27, 2020

(51) Int. Cl.
| | | |
|---|---|---|
| H01L 21/8234 | (2006.01) |
| H01L 29/417 | (2006.01) |
| H01L 29/78 | (2006.01) |
| H01L 21/768 | (2006.01) |

(52) U.S. Cl.
CPC ........... H01L 21/823475 (2013.01); H01L 21/76832 (2013.01); H01L 21/823468 (2013.01); H01L 29/41791 (2013.01); H01L 29/7851 (2013.01)

(58) Field of Classification Search
CPC ............................................. H01L 21/823475
USPC ............................................................ 257/401
See application file for complete search history.

(56) References Cited

U.S. PATENT DOCUMENTS

| | | |
|---|---|---|
| 8,580,628 B2 | 11/2013 | Labonte et al. |
| 8,653,505 B2 | 2/2014 | Cuozzo et al. |
| 8,927,403 B2 | 1/2015 | Huotari et al. |
| 9,379,058 B2 | 6/2016 | Song et al. |
| 9,508,818 B1 | 11/2016 | Basker et al. |
| 9,735,242 B2 | 8/2017 | Xie et al. |
| 9,780,178 B2 | 10/2017 | Xie et al. |
| 9,818,651 B2 | 11/2017 | Bouche et al. |
| 9,824,921 B1 | 11/2017 | Labonte et al. |
| 9,905,671 B2 | 2/2018 | Cheng et al. |
| 9,941,278 B2 | 4/2018 | Labonte et al. |
| 2002/0177322 A1 | 11/2002 | Li et al. |

(Continued)

OTHER PUBLICATIONS

Farm, "Selective-Area Atomic Layer Deposition," Academic Dissertation, University of Helsinki, Finland (Nov. 2011) (71 pages).

(Continued)

*Primary Examiner* — Ajay Arora
(74) *Attorney, Agent, or Firm* — Daniel Morris; Michael J. Chang, LLC

(57) ABSTRACT

Techniques for forming contact over active gate free of metal recess are provided. In one aspect, a method for forming a COAG device includes: forming gates over an active area of a wafer; forming source and drains on opposite sides of the gates; burying the gates in an ILD; forming source/drain contacts in the ILD between the gates; depositing a sacrificial metal selectively on the source/drain contacts with first gaps present in the sacrificial metal over the gates; filling the first gaps with a first dielectric material to form gate caps over the gates; selectively removing the sacrificial metal which forms second gaps between the gate caps over the source/drain contacts; and filling the second gaps with a second dielectric material to form source/drain caps over the source/drain contacts. A COAG device is also provided.

14 Claims, 7 Drawing Sheets

(56) References Cited

U.S. PATENT DOCUMENTS

| | | | |
|---|---|---|---|
| 2008/0272439 A1 | 11/2008 | Kapoor et al. | |
| 2017/0278752 A1 | 9/2017 | Ryckaert et al. | |
| 2019/0139759 A1* | 5/2019 | Cheng | H01L 21/02362 |
| 2019/0229019 A1* | 7/2019 | Shu | H01L 21/76807 |

OTHER PUBLICATIONS

Kastenmeier et al., "Highly selective etching of silicon nitride over silicon and silicon dioxide," J. Vac. Sci. Technol. A 17(6), pp. 3179-3184 Nov./Dec. 1999.

* cited by examiner

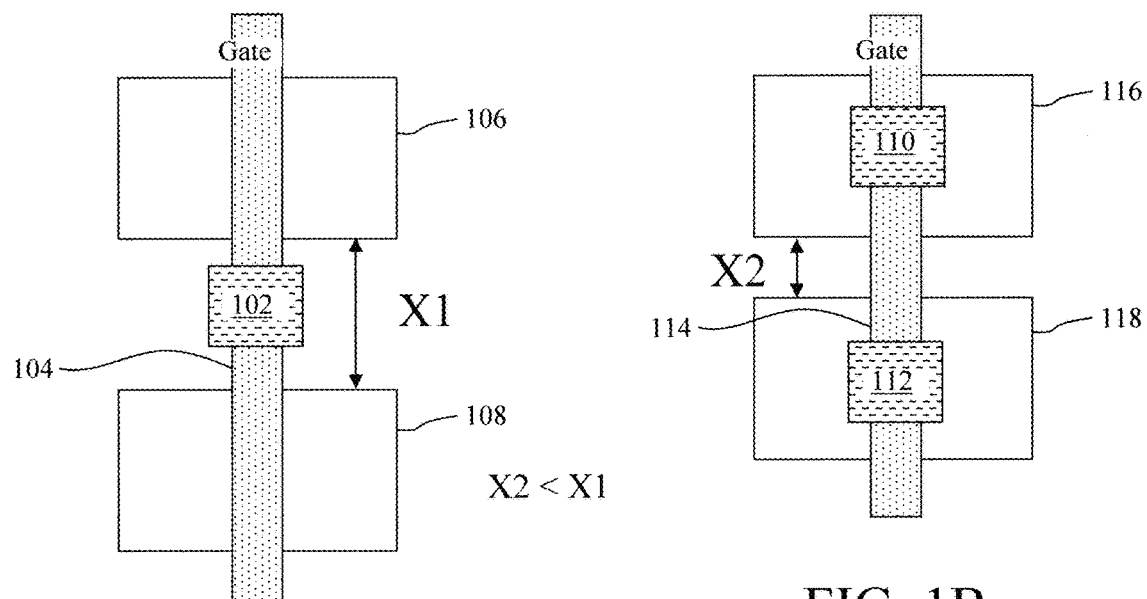
FIG. 1A
FIG. 1B
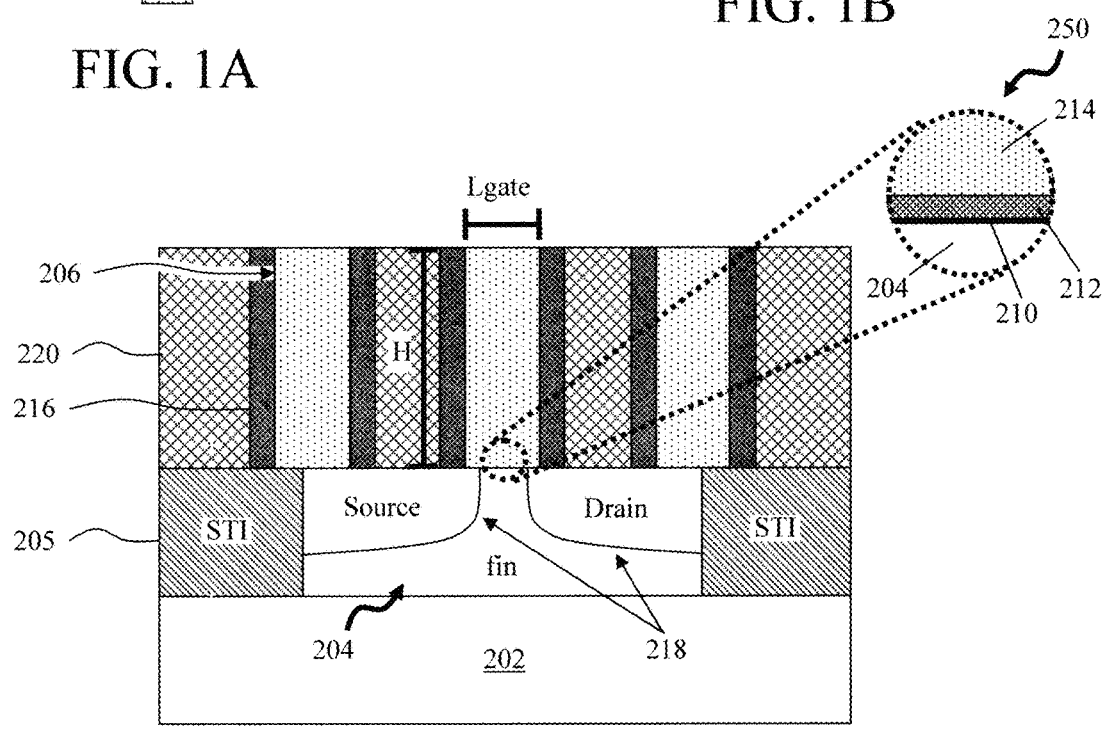
FIG. 2

US 10,832,963 B2

FORMING GATE CONTACT OVER ACTIVE FREE OF METAL RECESS

FIELD OF THE INVENTION

The present invention relates to contact over active gate (COAG) layout designs, and more particularly, to techniques for forming contact over active gate free of metal recess.

BACKGROUND OF THE INVENTION

Some notable design features can be implemented for complementary metal-oxide semiconductor (CMOS) scaling beyond the 10 nanometers (nm) node. For instance, metals such as cobalt (Co) can be used to replace conventional contact metals like tungsten (W) for interconnects in order to reduce middle-of-line (MOL) resistance. Contact over active gate (COAG) layout designs with reduced gate lengths can be used to increase device density.

However, there are some notable challenges associated with implementing these design features. For instance, to prevent shorts, COAG requires use of different dielectric caps, one on top of the gates, and another on top of the source and drain contacts. Metals like Co are used for the source and drain contacts. Forming the dielectric cap on top of the source and drain contact typically involves recessing the Co followed by dielectric deposition and planarization. However, recessing Co is a non-trivial process and can be subject to process issues such as non-uniform Co recess and undesired etching of Co by chemicals used for device fabrication.

Further, for a process that involves an aggressive recess to form the dielectric caps on top of the gates one must start with a tall gate. However, with a reduced gate length the gates are both tall and narrow, i.e., the gates have a high aspect ratio. High aspect ratio gates are undesirably prone to collapsing during fabrication, resulting in the formation of inoperable devices.

Therefore, improved COAG techniques that do not rely on metal recess for forming dielectric caps and which avoid gate collapse would be desirable.

SUMMARY OF THE INVENTION

The present invention provides techniques for forming contact over active gate free of metal recess. In one aspect of the invention, a method for forming a contact over active gate (COAG) device is provided. The method includes: forming gates over an active area of a wafer; forming source and drains in the active area on opposite sides of the gates offset from the gates by gate spacers; burying the gates in an interlevel dielectric (ILD); forming source and drain contacts in the ILD between the gates; depositing a sacrificial metal selectively on the source and drain contacts with first gaps present in the sacrificial metal over the gates; filling the first gaps with a first dielectric material to form gate caps over the gates; selectively removing the sacrificial metal which forms second gaps between the gate caps over the source and drain contacts; and filling the second gaps with a second dielectric material to form source and drain caps over the source and drain contacts.

In another aspect of the invention, a COAG device is provided. The COAG device includes: gates disposed over an active area of a wafer; source and drains formed in the active area on opposite sides of the gates offset from the gates by gate spacers; a high resistivity layer on top of at least one of the gates; an ILD surrounding the gates; source and drain contacts formed in the ILD between the gates; gate caps disposed over the high resistivity layer including a first dielectric material; and source and drain caps disposed over the source and drain contacts including a second dielectric material.

A more complete understanding of the present invention, as well as further features and advantages of the present invention, will be obtained by reference to the following detailed description and drawings.

BRIEF DESCRIPTION OF THE DRAWINGS

FIG. 1A is a top-down diagram of a conventional chip layout where contact to the gate is made outside of the active areas;

FIG. 1B is a top-down diagram of a contact over active gate (COAG) layout where contacts to the gate are present over the active areas, effectively reducing the active area-to-area spacing according to an embodiment of the present invention;

FIG. 2 is a cross-sectional diagram illustrating at least one active area having been formed in a wafer, at least one gate having been formed over the active area, gate spacers having been formed alongside the gates, source and drains having been formed on opposite sides of the gates, and the gates having been buried in an interlevel dielectric (ILD) according to an embodiment of the present invention;

DETAILED DESCRIPTION OF PREFERRED EMBODIMENTS

Figure 3:
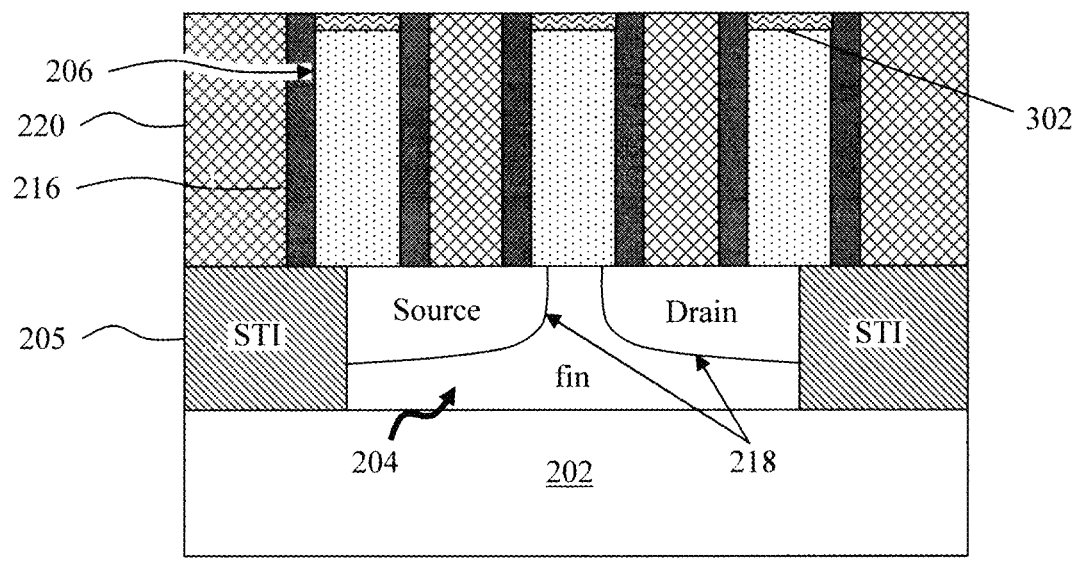
FIG. 3 is a cross-sectional diagram illustrating a thin, high resistivity layer having been formed on top of the gates according to an embodiment of the present invention.
Figure 4:
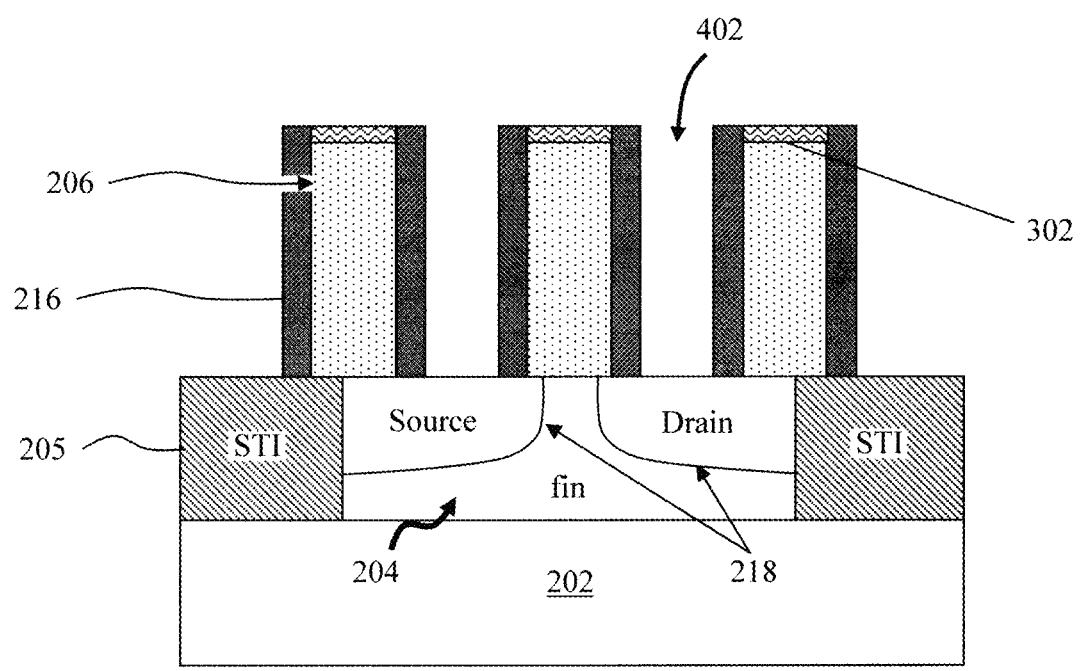
FIG. 4 is a cross-sectional diagram illustrating the ILD having been removed from over the source and drains forming contact trenches between the gates according to an embodiment of the present invention.

As provided above, contact over active gate (COAG) layout designs increase device density. See, for example, FIG. 1A and FIG. 1B. FIG. 1A is a top-down diagram of a conventional chip layout where contact 102 to the gate 104 is made outside of the active areas 106 and 108. As shown in FIG. 1A, this configuration requires a large active area-to-area spacing X1, and thus an increased cell area.

By comparison, a COAG layout where contacts 110 and 112 to gate 114 are present over the active areas 116 and 118, respectively, effectively reduces the active area-to-area spacing, i.e., to X2, where X2<X1. See FIG. 1B. The result is a smaller cell size.

However, as provided above, there are a number of notable challenges associated with implementing a COAG layout. For instance, conventional process flows for COAG typically involve recessing the source and drain contacts and then depositing a dielectric cap onto the (recessed) contacts. While metals such as cobalt (Co) are desirable for lowering middle-of-line (MOL) resistance of the source and drain contacts, uniformly recessing these metals can be challenging.

In a COAG layout, a different dielectric cap is needed on the gates. Processes that rely on an aggressive metal recess prior to forming the dielectric cap on the gates naturally needs a taller starting gate. However, gates that are tall and narrow are prone to collapse during fabrication.

Advantageously, provided herein are techniques for forming a COAG device that do not require gate/source and drain contact metal recess for forming the dielectric caps. Namely, as will be described in detail below, a sacrificial metal cap is first formed selectively on the source and drain contacts, which enables a (first) dielectric cap to be formed on the gates. Removal of the sacrificial metal cap creates openings above the source and drain contacts, which are then filled with a (second) dielectric cap. All of this is performed without a metal recess (i.e., the process is free of metal recess). Thus, any drawbacks associated with non-uniform recess of contact metals like Co are altogether avoided. Further, since the process is free of metal recess, the starting gate height can be reduced. Lowering the aspect ratio renders more stable gates.

An exemplary methodology for forming a COAG device in accordance with the present techniques is now described by way of reference to FIGS. 2-13. As shown in FIG. 2, the process begins with the formation of at least one active area 204 in a wafer 202. As shown in FIG. 2, the active area contains fins or other active devices formed using a standard complementary metal-oxide semiconductor (CMOS) process. Namely, the present techniques are generally applicable to any planar or non-planar device configurations (e.g., fin field-effect transistor (finFET), nanowire FET, nanosheet FET, etc.).

According to an exemplary embodiment, wafer 202 is a bulk semiconductor wafer, such as a bulk silicon (Si), bulk germanium (Ge), bulk silicon germanium (SiGe) and/or bulk III-V semiconductor wafer. Alternatively, wafer 202 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor.

As shown in FIG. 2, isolation of the active area 204 is achieved using a process such as shallow trench isolation (STI). See STI regions 205. By way of example only, STI regions 205 contain any suitable insulator material(s) including, but not limited to, oxide insulators such as silicon oxide referred to herein generally as an 'STI oxide.' STI regions 206 can further include other dielectric materials such as silicon nitride (SiN) and/or silicon oxynitride (SiON) liners on STI trench sidewalls.

At least one gate 206 is formed over the active area 204. According to an exemplary embodiment, each gate 206 is formed from a stack of layers (i.e., a gate stack) which includes an interfacial oxide 210 on exposed surfaces of the active devices, a gate dielectric 212 disposed over the interfacial oxide 210, and a gate conductor 214 disposed on the gate dielectric. See magnified view 250.

By way of example only, interfacial oxide 210 can be formed by an oxidation process. According to an exemplary embodiment, interfacial oxide 210 is formed having a thickness of from about 0.3 nanometers (nm) to about 5 nm and ranges therebetween, e.g., about 1 nm.

Suitable gate dielectrics include, but are not limited to, silicon oxide (SiOx), silicon nitride (SiN), silicon oxynitride (SiOxNy), high-κ materials, or any combination thereof. The term "high-κ" as used herein refers to a material having a relative dielectric constant κ which is much higher than that of silicon dioxide (e.g., a dielectric constant κ is about 25 for hafnium oxide ($HfO_2$) rather than 3.9 for $SiO_2$). Suitable high-κ materials include, but are not limited to, metal oxides such as hafnium oxide ($HfO_2$), hafnium silicon oxide (HfSiOx), hafnium silicon oxynitride (HfSiOx), lanthanum oxide ($La_2O_3$), lanthanum aluminum oxide ($LaAlO_3$), zirconium oxide ($ZrO_2$), zirconium silicon oxide ($ZrSiO_4$), zirconium silicon oxynitride (ZrSiOxNy), tantalum oxide (TaOx), titanium oxide (TiOx), barium strontium titanium oxide ($BaO_6SrTi_2$), barium titanium oxide ($BaTiO_3$), strontium titanium oxide ($SrTiO_3$), yttrium oxide ($Y_2O_3$), aluminum oxide ($Al_2O_3$), lead scandium tantalum oxide ($Pb(Sc,Ta)O_3$), and/or lead zinc niobite (Pb(Zn,Nb)O). The high-κ can further include dopants such as lanthanum (La), aluminum (Al) and/or magnesium (Mg). The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. According to an exemplary embodiment, gate dielectric 212 has a thickness of from about 1 nm to about 5 nm and ranges therebetween, although less thicknesses and greater thicknesses are also conceived.

Suitable gate conductors include, but are not limited to, doped polycrystalline or amorphous silicon (Si), germanium (Ge), silicon germanium (SiGe), a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. Ti$_3$Al, ZrAl), TaC, TaMgC, carbon nanotubes, conductive carbon, graphene, or any combinations thereof. The gate conductor can further include dopants that are incorporated during or after deposition. In some embodiments, the gate may further comprise a workfunction setting layer between the gate dielectric and gate conductor. The workfunction setting layer can be a workfunction metal. The workfunction metal can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and workfunction metal. The gate conductor and workfunction metal can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

Again, standard CMOS processes such as replacement metal gate or gate-first processes can be used to form the gates 206. Notably, however, the starting gate height can be reduced (when compared to typical COAG process flows). As provided above, reducing the aspect ratio of the gates advantageously increases their stability, as compared to the tall/narrow gates that are often employed and which are prone to collapsing. Namely, the present starting gate height H can be reduced by about an amount roughly equivalent to the final dielectric cap thickness on top of the gates 206 (e.g., about 30 nm). This is due to the fact that the present techniques do not rely on an aggressive recess of the gates 206 to form the thick dielectric caps on the gates 206. For instance, by way of example only, for a gate length (Lgate) of 15 nm, a 30 nm gate height reduction (e.g., from about 150 nm to about 120 nm for the starting gate height) reduces the aspect ratio (i.e., the ratio between the gate height H and gate length Lgate) of the gates 206 from 10 to 8. The lower aspect ratio renders more stable gates 206.

Gate spacers 216 are then formed alongside the gates 206. See FIG. 2. Suitable materials for the gate spacer 216 include, but are not limited to, silicon oxide, SiN, silicon carbide (SiC), SiON, carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), and combinations thereof. The spacer material can be a low-k material having a dielectric constant less than about 7, less than about 5. Gate spacers 216 can be formed by any suitable techniques such as deposition followed by a directional etch. Suitable deposition processes include, but are not limited to, ALD and CVD. Suitable directional etching processes include, but are not limited to, reactive ion etch (RIE). Gate spacers 216 offset the gates 206 from source and drains 218.

Namely, as shown in FIG. 2, source and drains 218 are next formed on opposite sides of the gates 206. Source and drains 218 can be formed by incorporating dopants into the wafer 202 on opposite sides of the gates 206. According to an exemplary embodiment, dopants are incorporated into the wafer 202, for example, by ion implantation, gas phase doping, plasma doping, plasma immersion ion implantation, cluster doping, infusion doping, liquid phase doping, solid phase doping, and/or any suitable combination of these techniques. In some embodiments, dopants are activated by thermal annealing such as laser annealing, flash annealing, rapid thermal annealing (RTA) or any suitable combination of these techniques. For Si, SiGe and Ge, suitable n-type dopants include, but are not limited to, phosphorous (P), arsenic (As) and/or antimony (Sb), and suitable p-type dopants include, but are not limited to, boron (B), gallium (Ga), indium (In), and/or thallium (Tl). According to another exemplary embodiment, source and drains 218 are formed from an epitaxial material that is doped during deposition (in-situ doped) by adding the n-type or p-type dopants provided above depending on the type of transistor. The use of an in-situ doping process is however merely an example. For instance, one may instead employ an ex-situ process to introduce dopants into the source and drains 218. Epitaxial materials can be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metalorganic chemical vapor deposition (MOCVD), ultrahigh vacuum chemical vapor deposition (UHVCVD), low-pressure chemical vapor deposition (LPCVD), limited reaction processing CVD (LRPCVD), or other suitable process. Epitaxial Si, SiGe, Ge, and/or carbon doped silicon (Si:C) silicon. According to an exemplary embodiment, the dopant concentration in the source and drains 218 is from—about $1 \times 10^{19}$ cm$^{-3}$ to about $3 \times 10^{21}$ cm$^{-3}$ and ranges therebetween, preferably from about $2 \times 10^{20}$ cm$^{-3}$ to about $3 \times 10^{21}$ cm$^{-3}$ and ranges therebetween.

The gates 206 are then buried in an interlevel dielectric (ILD) 220. Suitable ILDs include, but are not limited to, oxides such as silicon oxide (SiOx) and/or silicon oxycarbide (SiOCH). In some embodiments, the ILD further includes a silicon nitride (SiN) liner. Following deposition, the ILD 220 is planarized using a process such as chemical mechanical polishing (CMP).

A thin, high resistivity layer 302 is then formed on top of the gates 206. See FIG. 3. According to an exemplary embodiment, the high resistivity layer 302 is formed by implantation of ions such as nitrogen (N), carbon (C), and/or oxygen (O) into a top surface portion of the gates 206. For instance, according to an exemplary embodiment, the high resistivity layer 302 is formed by exposing the gates 206 to plasma containing nitrogen (N), carbon (C), and/or oxygen (O) ions, thereby converting the top portion of the (metal) gates 206 (e.g., tungsten) into a high resistivity metallic compound (e.g., nitrogen-rich tungsten nitride). In one exemplary embodiment, the high resistivity layer 302 is formed having a thickness of from about 3 nanometers (nm) to about 10 nm and ranges therebetween, depending on the ion implantation condition (dose, energy, angle, etc.) or plasma condition (pressure, time, etc.). By 'high resistive', it is meant that the layer 302 has an (electrical) resistivity that is substantially higher than the resistivity of the gates 206 into which the ions are implanted. By way of example only, the high resistivity layer 302 has a resistivity of from about $1 \times 10^{-5}$ Ohms per meter ($\Omega$m) to about $1 \times 10^{-3}$ $\Omega$m and ranges therebetween at 20° C. In contrast, the metal gate typically has a resistivity of from $1 \times 10^{-7}$ $\Omega$m to $1 \times 10^{-8}$ $\Omega$m.

The next task is to form contact to the source and drains 218. To do so, the ILD 220 is removed from over the source and drains 218 forming contact trenches 402 between the gates 206. See FIG. 4. A directional (i.e., anisotropic) etching process such as RIE can be used to clear the ILD 220. A mask (not shown) can be used to protect the ILD 220 in other regions (not shown) of the chip where contacts are not needed.

The contact trenches 402 are then filled with a contact metal(s) to form source and drain contacts 502. See FIG. 5. According to an exemplary embodiment, source and drain contacts 502 include a stack of layers including a (conformal) liner 504 lining the bottom and sidewalls of the contact trenches 402, a (conformal) barrier layer 506 disposed on the liner 504 along the bottom and sidewalls of the contact trenches 402, and a fill metal 508 on the barrier layer 506 filling the contact trenches 402. See magnified view 550.

Suitable materials for the liner 504 include, but are not limited to, titanium (Ti), ruthenium (Ru), tantalum (Ta) and/or manganese (Mn). According to an exemplary embodiment, the liner 504 is deposited into the contact trenches 402 using a conformal deposition process such as CVD, ALD, or PVD to a thickness of from about 1 nm to about 5 nm and ranges therebetween. Suitable materials for the barrier layer 506 include, but are not limited to, titanium nitride (TiN) and/or tantalum nitride (TaN). According to an exemplary embodiment, the barrier layer 506 is deposited onto the liner 504 using a conformal deposition process such as CVD, ALD, or PVD to a thickness of from about 3 nm to about 10 nm and ranges therebetween. Suitable fill metals 508 include, but are not limited to, cobalt (Co), tungsten (W), copper (Cu), nickel (Ni), silver (Ag) and/or gold (Au). According to an exemplary embodiment, the fill metal 508 is deposited onto the barrier layer 506 by CVD, ALD, PVD, electrochemical plating, etc.

The source and drain contacts 502, as deposited, are then planarized using a process such as CMP. As such, the source and drain contacts 502 are coplanar with the high resistivity layer 302 on top of the gates 206. See FIG. 5.

A sacrificial metal 602 is then selectively deposited onto the source and drain contacts 502. See FIG. 6. By 'sacrificial' it is meant that the metal 602 is placed to permit a dielectric cap to be formed over the gates 206 (see below) and will be removed later on in the process. Suitable sacrificial metals 602 include, but are not limited to, tungsten (W), ruthenium (Ru), platinum (Pt), palladium (Pd) and/or manganese (Mn). In some embodiments, the sacrificial metal 602 includes a different material from the material of the source and drain contacts 502. For instance, in an example embodiment the source and drain contacts 502 are formed from cobalt (Co) and the sacrificial metal 602 is tungsten (W).

Advantageously, the differences in resistivity between the source and drain contacts 502 versus the high resistivity of layer 302 on the gates 206 can be leveraged to obtain the selective placement of the sacrificial metal 602 on only the source and drain contacts 502 (and not over the gates 206). For example, cobalt (Co) and tungsten (W) have a resistivity on the order of $10^{-8}$ Ωm at 20° C. which is much less than the resistivity of layer 302 (e.g., from about $1\times10^{-5}$ Ωm to about $1\times10^{-3}$ Ωm and ranges therebetween depending on the implant dose) at the same temperature.

A process such as described in U.S. Pat. No. 8,927,403 issued to Huotari et al., entitled "Selective Deposition of Noble Metal Thin Films" (hereinafter "U.S. Pat. No. 8,927,403"), the contents of which are incorporated by reference as if fully set forth herein, can be employed to selectively form the sacrificial metal 602 on the source and drain contacts 502. For instance, as described in U.S. Pat. No. 8,927,403, contacting a conductive metal (such as the exposed top surfaces of the source and drain contacts 502 in this case) with a noble metal precursor (e.g., Ru, Pt and/or Pd) and reactant (e.g., oxygen, ozone and/or ammonia) using a vapor deposition process, such as ALD at a temperature of less than about 400° C., results in the formation of a film of the noble metal(s) on the conductive metal surface as opposed to other non-conductive surfaces (such as the high resistivity layer 302 and tops of the gate spacer 216 in this case).

In general, however, any suitable selective deposition process may be employed in accordance with the present techniques to form the sacrificial metal 602 on only the source and drain contacts 502. For instance, by way of example only, an area-selective ALD process may also be used whereby a self-assembled monolayer (SAM) of a polymer is performed to cover/mask a first surface (such as the high resistivity layer 302 and tops of the gate spacer 216 in this case) limiting growth of a metal(s) (such as the sacrificial metal 602 in this case) on un-masked second surfaces (such as the exposed top surfaces of the source and drain contacts 502 in this case) by ALD. An example of such an area-selective ALD process is described, for example, in Farm, "Selective-Area Atomic Layer Deposition," Academic Dissertation, University of Helsinki, Finland (November 2011) (71 pages), the contents of which are incorporated by reference as if fully set forth herein.

According to an exemplary embodiment, the sacrificial metal 602 is deposited to a thickness t of from about 20 nm to about 30 nm and ranges therebetween. As will become apparent from the description that follows, this thickness t correlates to a thickness of the dielectric caps that will be formed over the gates 206 (since the dielectric caps over the gates 206 will be formed in the gaps in the sacrificial metal 602 over the gates 206).

Figure 6:
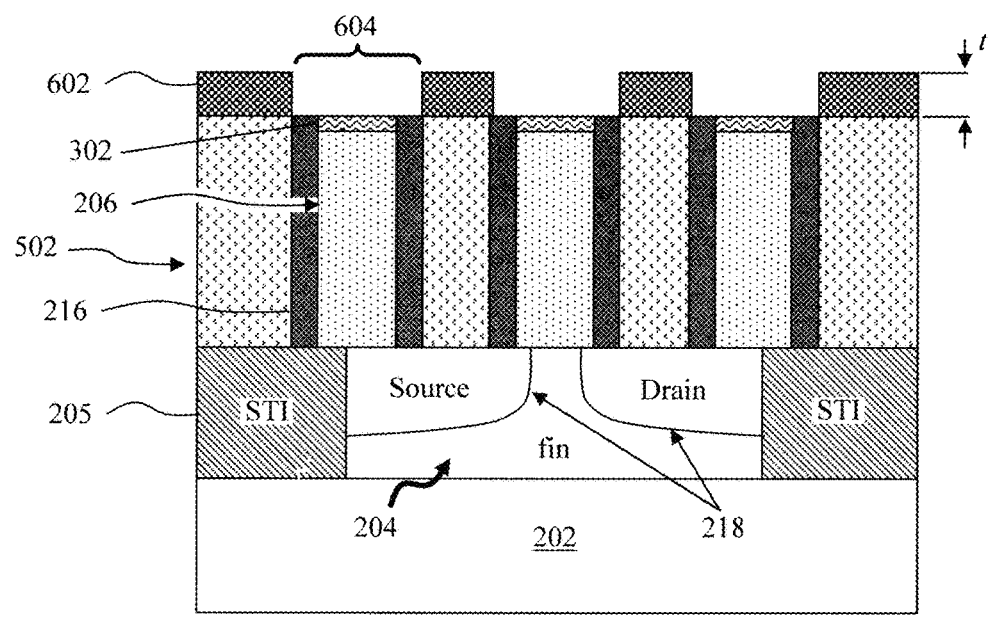
FIG. 6 is a cross-sectional diagram illustrating a sacrificial metal having been selectively deposited onto the source and drain contacts with (first) gaps over the high resistivity layer/gates according to an embodiment of the present invention.
Figure 7:
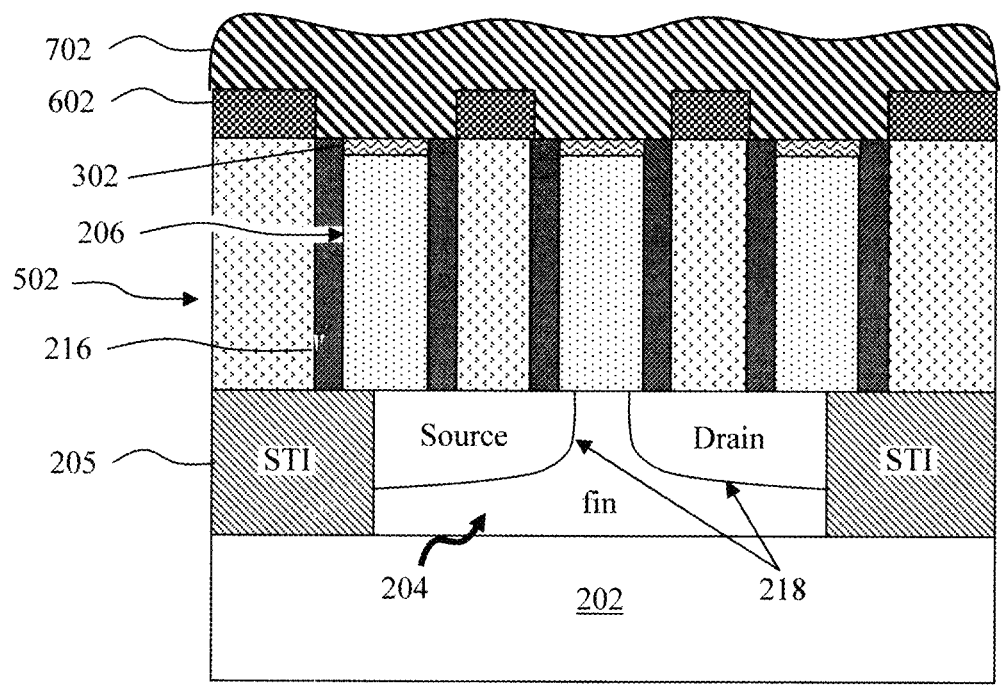
FIG. 7 is a cross-sectional diagram illustrating a first dielectric material having been deposited onto the sacrificial metal, filling the first gaps according to an embodiment of the present invention.

Namely, as shown in FIG. 6, based on the selective deposition of the sacrificial metal 602 on the source and drain contacts 502, gaps 604 are present in the sacrificial metal 602 over the high resistivity layer 302/gates 206. It is in these gaps 604 that the dielectric caps over the gates 206 (i.e., gate caps) will be formed. It is notable that the sacrificial metal 602 may grow laterally beyond the edge of the source/drain contact 502. Depending on the amount of lateral overgrowth, an etch back of the sacrificial metal 602 can be performed after the growth. In some embodiments, a cyclic process, i.e., repeating the selective growth/etch back multiple times, is performed until desired thickness and lateral growth of 602 are achieved.

To form the gate caps, a first dielectric material 702 is deposited onto the sacrificial metal 602, filling the gaps 604. Suitable first dielectric materials 702 include, but are not limited to, nitride dielectric materials such as SiN and/or SiOCN. By way of example only, the first dielectric material 702 can be deposited using a process such as CVD, ALD, or PVD.

Figure 8:
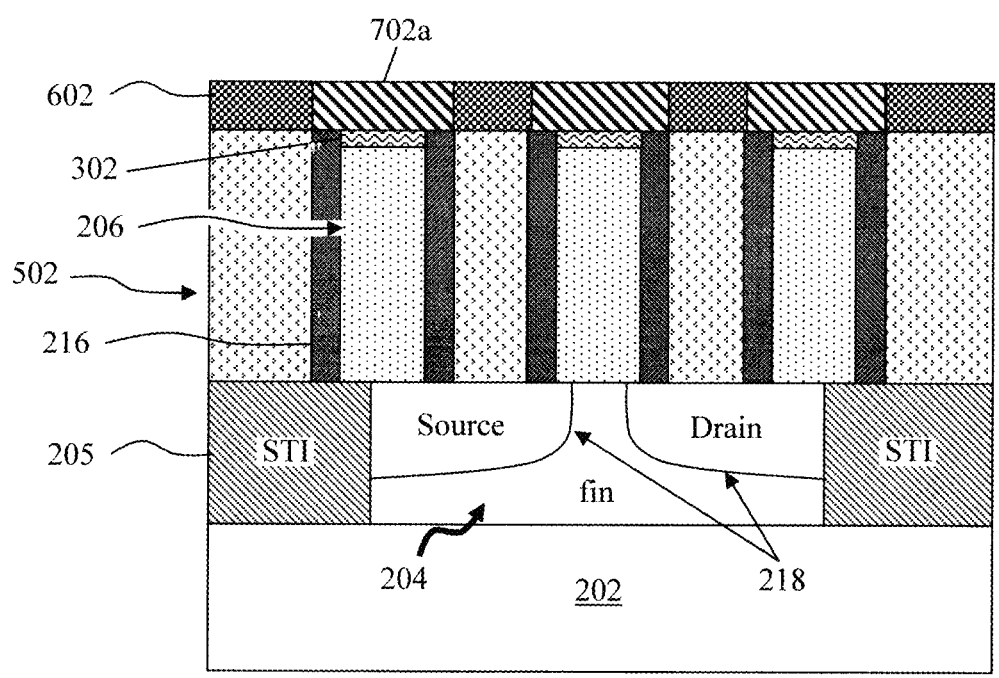
FIG. 8 is a cross-sectional diagram illustrating the first dielectric material having been planarized down to the surface of the sacrificial metal forming dielectric gate caps over the gates according to an embodiment of the present invention.

A process such as CMP is then used to planarize the first dielectric material 702 down to the surface of the sacrificial metal 602. See FIG. 8. As shown in FIG. 8, what remains following the planarization is the first dielectric material 702 in the gaps 604. This remaining material forms the dielectric gate caps 702a over the gates 206. As provided above, since the dielectric gate caps 702a fill the gaps 604 in the sacrificial metal 602, these layers should have equivalent thicknesses. Thus, according to an exemplary embodiment, like sacrificial metal 602, the dielectric gate caps 702a have a thickness of from about 20 nm to about 30 nm and ranges therebetween.

Figure 9:
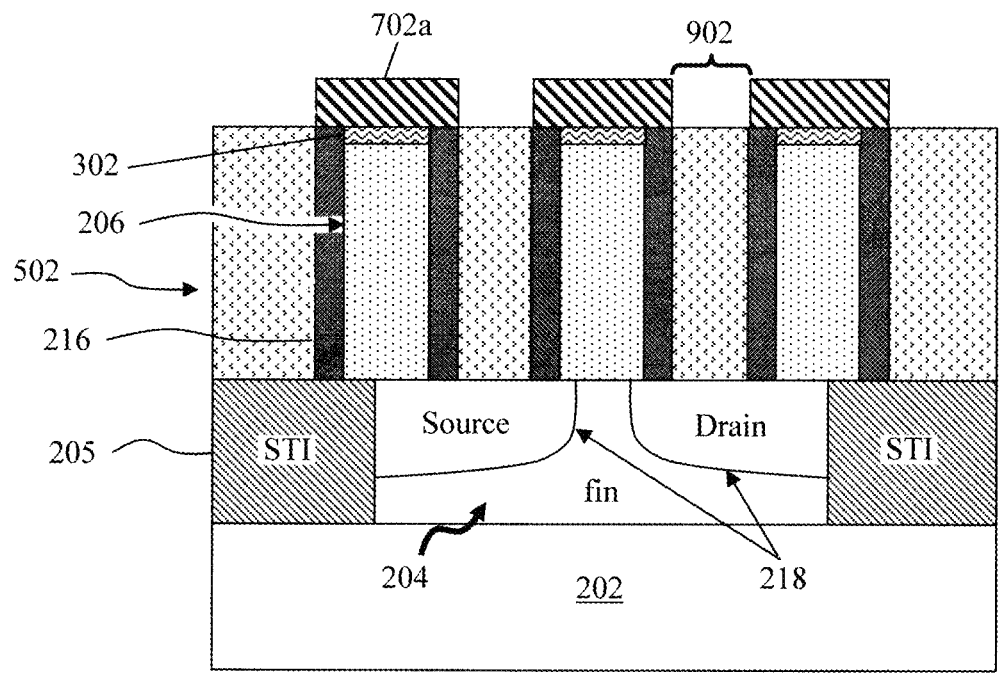
FIG. 9 is a cross-sectional diagram illustrating the sacrificial metal having been selectively removed forming (second) gaps over the source and drain contacts between the dielectric gate caps according to an embodiment of the present invention.
Figure 10:
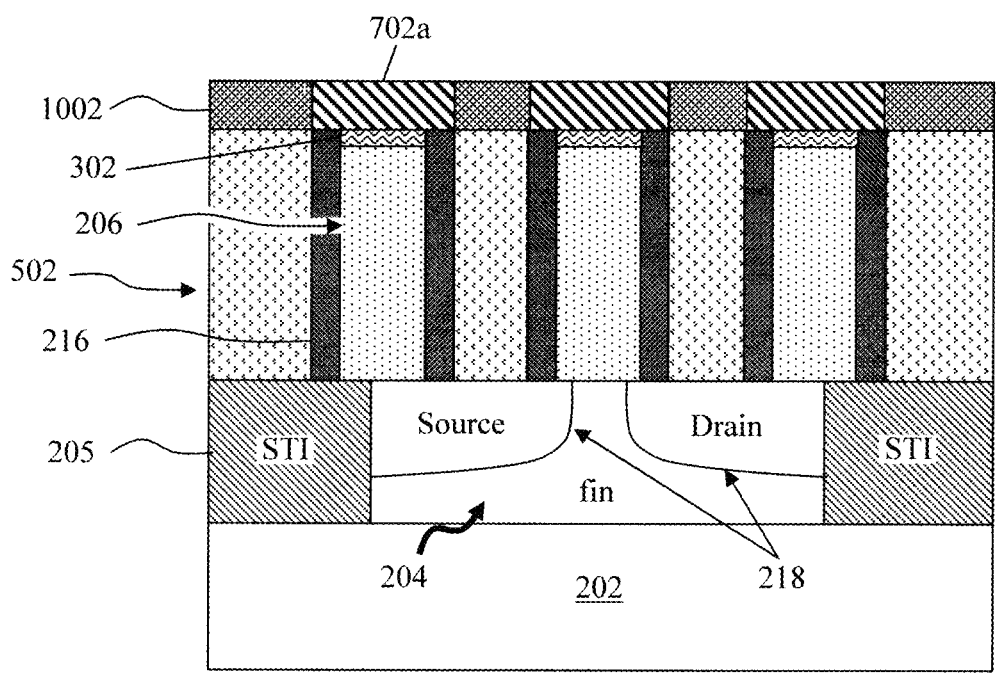
FIG. 10 is a cross-sectional diagram illustrating a second dielectric material having been deposited into the second gaps forming dielectric source and drain caps over the source and drain contacts according to an embodiment of the present invention.

The sacrificial metal 602 is then selectively removed. See FIG. 9. As shown in FIG. 9, removal of the sacrificial metal 602 forms gaps 902 over the source and drain contacts 502 between the dielectric gate caps 702*a*. It is in these gaps 902 that dielectric caps over the source and drain contacts 502 (i.e., source and drain caps) will be formed. By way of example only, sacrificial metal 602 can be removed selective to the dielectric gate caps 702*a* using a selective wet etch process or a selective dry etch process.

To form the source and drain caps, a second dielectric material is deposited (e.g., by CVD, ALD, or PVD) onto the dielectric gate caps 702*a*, filling the gaps 902 over the source and drain contacts 502. A process such as CMP is then used to planarize the as-deposited second dielectric material down to the surface of the dielectric gate caps 702*a*. What remains following the planarization is the second dielectric material in the gaps 902 between the dielectric gate caps 702*a* which forms dielectric source and drain caps 1002 over the over the source and drain contacts 502. See FIG. 10.

The source and drain caps 1002 are preferably formed from a different dielectric than the gate caps 702*a*. This will provide the needed etch selectivity during metallization (see below). Suitable materials for the second dielectric (which forms the source and drain caps 1002) include, but are not limited to, silicon carbide (SiC), SiCN, BN and/or $Al_2O_3$. Since the source and drain caps 1002 are formed in the gaps 902 between the gate caps 702*a*, the source and drain caps 1002 too will have a thickness of, for example, from about 20 nm to about 30 nm and ranges therebetween.

Figure 11:
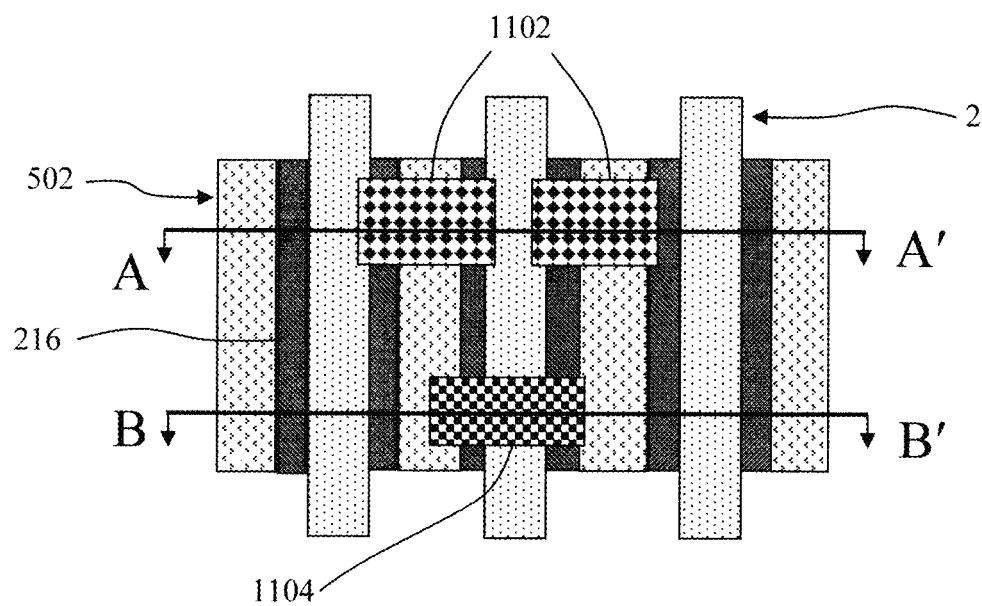
FIG. 11 is a top-down diagram illustrating first/second metal contacts having been formed to the source and drain contacts/gates according to an embodiment of the present invention.

With different dielectric caps on top of the gates 206 and source and drain contacts 502 (i.e., gate caps 702*a* and source and drain caps 1002, respectively) first/second contacts 1102/1104 are then formed to the source and drain contacts 502/gates 206, respectively. See FIG. 11. FIG. 11 provides a top-down view of the COAG device. The process for forming first/second contacts 1102/1104 will be described by way of reference to different cross-sectional cuts (i.e., A-A' and B-B') through the COAG device as illustrated in FIG. 11.

Figure 12:
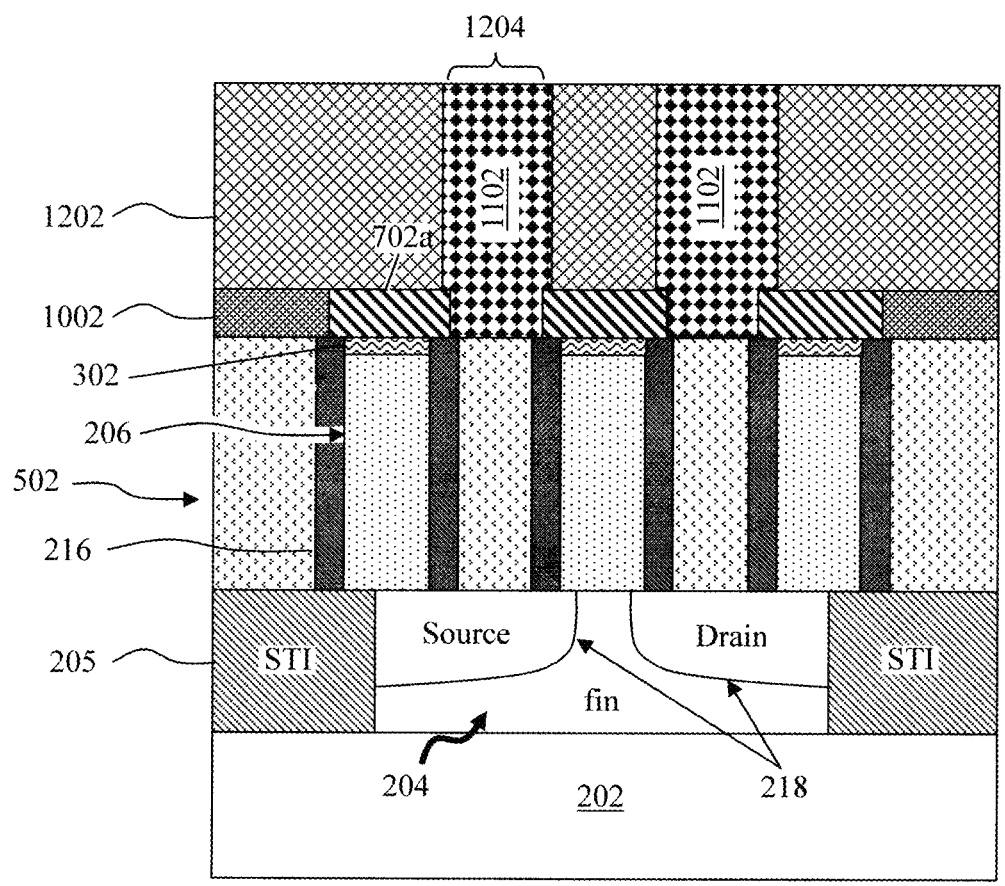
FIG. 12 is a cross-sectional diagram illustrating the first metal contacts having been formed to the source and drain contacts according to an embodiment of the present invention.

For instance, FIG. 12 provides a cross-sectional view along line A-A' of the COAG device. As shown in FIG. 12, an ILD 1202 is first deposited onto the gate caps 702*a* and source and drain caps 1002, and then planarized using a process such as CMP. As provided above, suitable ILDs include, but are not limited to, oxides such as SiOx and/or SiOCH.

Suitable patterning techniques such as lithography and etching are then used to pattern contact trenches 1204 in the ILD 1202 that extend through the source and drain caps 1002 down to the source and drain contacts 502. Advantageously, based on the above-described process, the source and drain caps 1002 are present between the gate caps 702*a* and are aligned to the underlying source and drain contacts 502. Thus, an etch selective for the source and drain caps 1002 will result in contact trenches 1204 that are self-aligned to the underlying source and drain contacts 502. As provided above, the source and drain caps 1002 can be formed from a material such as SiC, while the gate caps 702*a* can be formed from a nitride dielectric such as SiN and/or SiOCN. By way of example only, a plasma etch including a hydrogen-containing fluorocarbon gas such as fluoromethane ($CH_3F$), and an oxygen-containing gas such as $O_2$ can be used to clear the SiC source and drain caps 1002 selective to the nitride gate caps 702*a*. See, for example, U.S. Patent Application Publication Number 2002/0177322 by Li et al., entitled "Method of Plasma Etching of Silicon Carbide," the contents of which are incorporated by reference as if fully set forth herein.

Figure 5:
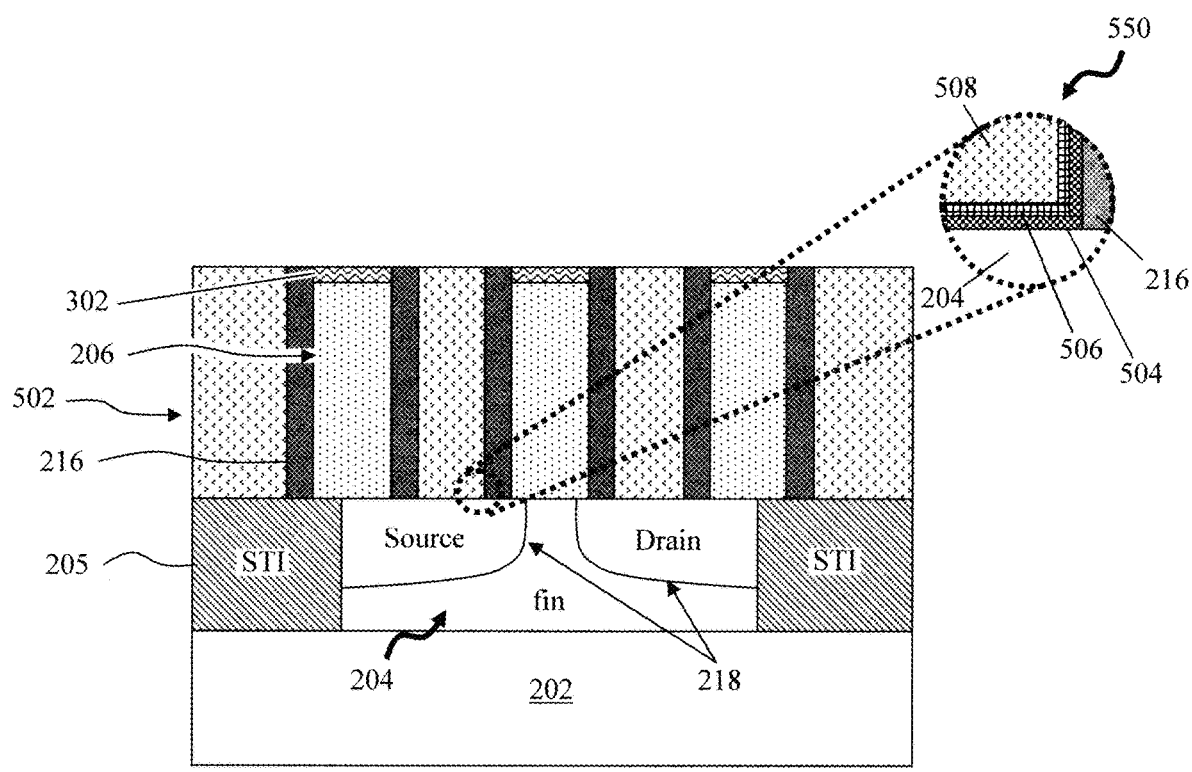
FIG. 5 is a cross-sectional diagram illustrating the contact trenches having been filled with a contact metal(s) to form source and drain contacts according to an embodiment of the present invention.

The contact trenches 1204 are then filled with a conductive material such as a metal(s) (followed by planarization with a process such as CMP) to form the first contacts 1102. Suitable contact metals include, but are not limited to, Co, W, Cu, Al, Ru, Ni, Au and/or Ag. As also provided above, the contact trenches 1204 can be first lined with a combination of liner/barrier layers such as Ti/TiN. While not explicitly shown in FIG. 12, this liner/barrier layer configuration is depicted in FIG. 5 (described above).

Figure 13:
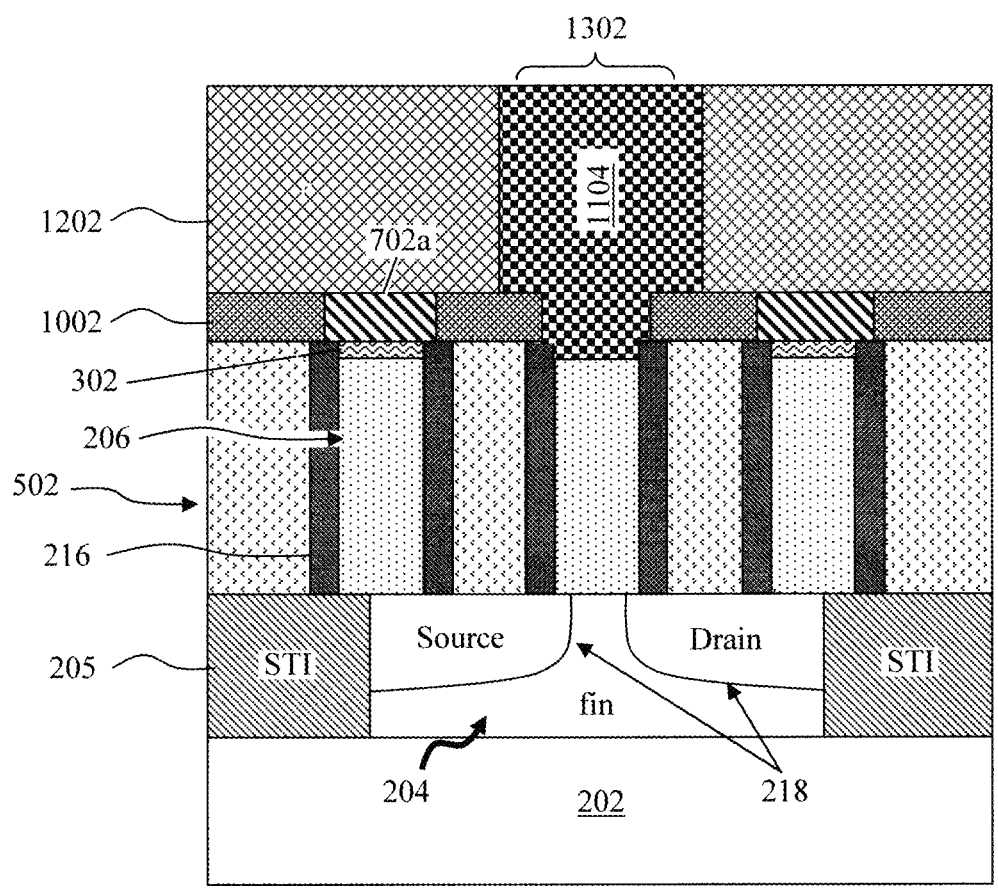
FIG. 13 is a cross-sectional diagram illustrating the second metal contacts having been formed to the gates according to an embodiment of the present invention.

FIG. 13 provides a cross-sectional view along line B-B' of the COAG device. As shown in FIG. 13, contact trenches 1302 are also patterned in the ILD 1202 that extend through the gate caps 702*a* (and through the high resistivity layer 302) down to the gates 206. Advantageously, based on the above-described process, the gate caps 702*a* are present between the source and drain caps 1002 and are aligned to the underlying gates 206. Thus, an etch selective for the gate caps 702*a* will result in contact trenches 1302 that are self-aligned to the underlying gates 206. As provided above, the gate caps 702*a* can be formed from a nitride dielectric such as SiN and/or SiOCN while the source and drain caps 1002 can be formed from a material such as SiC. By way of example only, a nitride-selective etching process such as a tetrafluoromethane ($CF_4$)— or nitrogen trifluoride ($NF_3$)-based etch chemistry. See, for example, Kastenmeier et al., "Highly selective etching of silicon nitride over silicon and silicon dioxide," J. Vac. Sci. Technol. A 17(6), pgs. 3179-3184 November/December 1999, the contents of which are incorporated by reference as if fully set forth herein.

The contact trenches 1302 are then filled with a conductive material such as a metal(s) (followed by planarization with a process such as CMP) to form the second contacts 1104. As provided above, suitable contact metals include, but are not limited to, Co, W, Cu, Al, Ru, Ni, Au and/or Ag. As also provided above, the contact trenches 1302 can be first lined with a combination of liner/barrier layers such as Ti/TiN. While not explicitly shown in FIG. 13, this liner/barrier layer configuration is depicted in FIG. 5 (described above).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for forming a contact over active gate (COAG) device, the method comprising the steps of:
    forming gates over an active area of a wafer;
    forming source and drains in the active area on opposite sides of the gates offset from the gates by gate spacers;
    burying the gates in an interlevel dielectric (ILD);
    forming source and drain contacts in the ILD between the gates;
    depositing a sacrificial metal selectively on the source and drain contacts with first gaps present in the sacrificial metal over the gates;
    filling the first gaps with a first dielectric material to form gate caps over the gates;
    selectively removing the sacrificial metal which forms second gaps between the gate caps over the source and drain contacts; and
    filling the second gaps with a second dielectric material to form source and drain caps over the source and drain contacts.

2. The method of claim 1, further comprising the steps of:
    depositing an additional ILD onto the gate caps and the source and drain caps;

forming first contact trenches in the additional ILD that extend through the source and drain caps down to the source and drain contacts; and filling the first contact trench with at least one conductive material to form first contacts to the source and drain contacts.

3. The method of claim 2, further comprising the steps of:

forming at least one second contact trench in the additional ILD that extend through the gate caps down to the gates; and filling the at least one second contact trench with the at least one conductive material to form second contacts to the gates.

4. The method of claim 1, wherein the sacrificial metal comprises a metal selected from the group consisting of: tungsten (W), ruthenium (Ru), platinum (Pt), palladium (Pd), Manganese (Mn), and combinations thereof.

5. The method of claim 1, wherein the sacrificial metal is deposited to a thickness of from about 20 nm to about 30 nm.

6. The method of claim 1, further comprising the steps of:

forming a high resistivity layer on top of the gates; and depositing the sacrificial metal on the source and drain contacts selective to the high resistivity layer on top of the gates.

7. The method of claim 6, wherein the step of forming the high resistivity layer on top of the gates comprises the step of:

implanting ions into a top surface portion of the gates.

8. The method of claim 7, wherein the ions are selected from the group consisting of: nitrogen ions, carbon ions, oxygen ions, and combinations thereof.

9. The method of claim 6, wherein the high resistivity layer has a thickness of from about 3 nm to about 10 nm.

10. The method of claim 6, wherein the high resistivity layer has a resistivity of from about $1\times10^{-5}$ $\Omega$m to about $1\times10^{-3}$ $\Omega$m at 20° C.

11. The method of claim 1, wherein the first dielectric material is selected from the group consisting of: silicon nitride (SiN), silicon oxycarbonitride (SiOCN), and combinations thereof.

12. The method of claim 1, wherein the gate caps have a thickness of from about 20 nm to about 30 nm.

13. The method of claim 1, wherein the second dielectric material is selected from the group consisting of: silicon carbide (SiC), silicon-carbon-nitride (SiCN), boron nitride (BN), aluminum oxide ($Al_2O_3$) and combinations thereof.

14. The method of claim 1, wherein the source and drain caps have a thickness of from about 20 nm to about 30 nm.

* * * * *